United States Patent
Iotov et al.

(10) Patent No.: US 7,992,119 B1
(45) Date of Patent: Aug. 2, 2011

(54) REAL-TIME BACKGROUND LEGALITY VERIFICATION OF PIN PLACEMENT

(75) Inventors: Mihail Iotov, San Jose, CA (US);
Kamal Patel, Campbell, CA (US);
Michael V. Wenzler, Oakland, CA (US)

(73) Assignee: Altera Corporation, San Jose, CA (US)

( * ) Notice: Subject to any disclaimer, the term of this patent is extended or adjusted under 35 U.S.C. 154(b) by 477 days.

(21) Appl. No.: 12/134,999

(22) Filed: Jun. 6, 2008

(51) Int. Cl.
*G06F 17/50* (2006.01)
(52) U.S. Cl. ........ 716/119; 716/116; 716/118; 716/122; 716/132
(58) Field of Classification Search .................. 716/2, 5, 716/9–11, 16, 17, 100, 102, 104, 106, 110, 716/116–119, 121, 122, 132
See application file for complete search history.

(56) References Cited

U.S. PATENT DOCUMENTS

| | | | | |
|---|---|---|---|---|
| 5,694,604 A | * | 12/1997 | Reiffin | 718/107 |
| 5,805,860 A | * | 9/1998 | Parham | 716/12 |
| 7,627,838 B2 | * | 12/2009 | Keswick | 716/2 |
| 2004/0128626 A1 | * | 7/2004 | Wingren et al. | 716/1 |
| 2007/0250800 A1 | * | 10/2007 | Keswick | 716/8 |

* cited by examiner

*Primary Examiner* — Sun J Lin
(74) *Attorney, Agent, or Firm* — Weaver Austin Villeneuve & Sampson LLP

(57) ABSTRACT

Pin placement legality is verified in real-time in a background to reduce a number of input/output assignment analysis runs during a physical design of a programmable logic device. Edited pin properties are checked quickly in the background against certain rules, and results displayed to a user usually before a new pin is edited. Available and legal positions are found and displayed for a selected pin to reduce errors.

27 Claims, 8 Drawing Sheets

REAL-TIME BACKGROUND LEGALITY VERIFICATION OF PIN PLACEMENT

FIELD OF THE INVENTION

The present disclosure generally relates to programmable logic devices, and more particularly, to a process of physical design of programmable logic devices.

DESCRIPTION OF RELATED ART

A Programmable Logic Device (PLD) is a semiconductor integrated circuit that contains fixed logic circuitry that can be programmed to perform a host of logic functions. In the semiconductor industry, PLDs are becoming increasingly popular for a number of reasons. Due to the advances of chip manufacturing technology, PLDs have improved density and speed performance. Sophisticated programming software enables complex logic functions to be rapidly developed for PLDs. Furthermore, logic designs generally can also be easily migrated from one generation of PLDs to the next, further reducing product development times. The closing of the price-performance gap with Application-Specific Integrated Chips (ASICs) and reduced product development times makes the use of PLDs compelling for many Original Equipment Manufacturers (OEMs) to integrate PLDs into their device design.

Every PLD has inputs and outputs (I/Os). With growing device complexities the I/Os are also growing complex. PLD I/Os support a lot of different I/O standards and various other I/O features such drive strengths, termination, slew rate, etc. These I/O features are useful in implementing complex I/O interfaces such as DDR, LVDS, transceivers, etc. These complexities often result in rules and restrictions on how these I/Os can be used. Complex I/Os mean complex rules and restrictions. Within these rules and restrictions, the PLD I/Os need to remain flexible to allow a variety of implementations. A PLD such as a field programmable gate array (FPGA) has many of these rules, usually in the order of tens or even close to a hundred rules.

Having many I/O rules and restrictions results in prolonged design time for customers in getting pinouts for their designs. Pinout assignments are a manual process where designers often assign one pin at a time by entering information in a table or spreadsheet. As PLDs become more complicated and I/O rules and restrictions increase, improvements in the pin assignment and placement process are needed.

SUMMARY OF THE INVENTION

Programming a PLD requires both logic description design and physical design. A portion of the physical design is input and output (I/O) pin assignments of pin properties that are subject to a number of I/O rules and restrictions. Pin properties to be assigned includes physical locations and electrical properties, e.g., pin position, input/output standard voltage, reference voltage, current density, current strength, input/output direction, slew rate, termination, pre-emphasis, slew rate, toggling rate, bus hold, weak pull-up, and equalization. A legal pin assignment is one that meets the I/O rules and restrictions. The present invention improves the pin assignment and placement process. Pin assignment legality is verified in real-time to reduce the number of input/output assignment analysis runs during physical design of a PLD. The verification process runs on a background thread and preferably on a different processor than the assignment program. Edited pin properties are checked quickly against certain rules, and results displayed to the user usually before a new pin is edited. Available and legal positions are found and displayed for a selected pin.

According to one aspect of the invention, a technique of pin assignment in a PLD design and computer instructions on a machine readable medium for executing the technique are provided. One or more modules (pin planning GUI, I/O checking module, full checking module) in a pin planning software tool are started before one or more pin property edit is received. The edited property or properties is checked against a number of I/O rules, and results displayed. The results are shown in a user-friendly format as part of a graphical user interface (GUI). The checking is performed in the background, preferably on a background thread on a different processor from the GUI. The checking is performed automatically and instantly upon a pin property edit without further input from the user. The displaying is also performed automatically when the checking is completed. The type and matter of display depends on previously entered user preferences. The GUI may call and optionally start the I/O checking module. Communication between the GUI and the checking module is made via pipe, via tcl api commands, or via binary calls.

The I/O rules and restrictions are separated into I/O buffer rules and I/O system rules. I/O buffer rules are generally those that do not require a netlist traversal. Examples include voltage compatibility rules, current-density rules, Simultaneously Switching Output (SSO) rules, current strength rules, I/O standard rules, and I/O location compatibility rules. I/O system rules may require netlist traversals to verify. Generally, I/O system rules are more complicated than buffer rules and requires status of other pins and components be known. Examples include requirement that dynamic phase alignment (DPA) groups have a 1-channel buffer zone in between and that corner phase locked loops (PLL) not drive (low voltage differential signal) LVDS channels outside their quadrants. The I/O checking module checks all I/O buffer rules and optionally I/O system rules.

The results displayed may be number of errors, number of warnings, status of check (e.g., failed, success, and passed with warnings), reason for error and warnings, and combinations of these. The results may be displayed in a pop-up box, graphically on the GUI, or added to a text message box. Various symbols and colors may be used to denote a certain status such as error, warning, failure, or success. The user can control the display and presentation of the results. The one or more pin property edited can include pin position, input/output standard voltage, reference voltage, current density, current strength, input/output direction, slew rate, termination, pre-emphasis, slew rate, toggling rate, bus hold, weak pull-up, and equalization, and other pin properties available for editing.

In another aspect, the technique of pin assignment includes starting a pin planning tool, enabling an input/output checking module for checking I/O rules, editing one or more pin properties, and receiving a message of a legality status of the edited pin. The editing of one or more pin properties includes typing information in a table or spreadsheet, moving a pin on a GUI with a mouse (click and drag), and selecting values from drop down box. After the edit, a message of a legality status of the edited pin is received automatically and quickly, in about 3 seconds or less, preferably before another pin property edit is entered and preferably before any intermediate operation.

In another aspect, a technique of pin placement in a PLD design is provided. A pin planning tool is started. The starting operation may include starting one or more modules, such as a graphic user interface module for placing pins, an I/O checking module, or a batch processing module checking all the I/O rules. A pin selection for placement is received. The selected pin properties are checked for I/O rules against all potential pin positions on a background thread. Results of the checking operation are displayed. The checking may be performed for only unassigned pin positions or for all positions. The result may be displayed as a map or list of all available, unavailable, legal, and illegal positions for the selected pin. In some embodiments, the background thread is run on a different processor from a foreground thread associated with the GUI. Additionally, the GUI may call the I/O checking module with a checking available placement command for a selected pin.

In yet another aspect, a technique of pin placement in a PLD and computer instructions on a machine readable medium for executing the technique are provided. A pin planning software is started. An I/O checking module for checking a subset of I/O rules is enabled. The user selects a pin and very quickly, in the matter of seconds, receives an indication of legal or available positions for the selected pin. The technique may also include editing one or more pin properties before selecting the pin to place. In one example in accordance with the present invention, a user may enable pin placement function for the I/O checking module and select or click on a pin with a mouse. While the pin remains selected, various pin positions on a map or list become grayed out. The selected pin may be moved over the map or list by dragging it with a mouse. When the pin is dragged over a legal or available position, the position becomes highlighted. When the pin is dragged over an illegal position, the position remains grayed out. The user may then drop the pin into a position, which does not necessarily have to be legal.

One feature of the present invention is a reduction in the time to verify the legality of a pin assignment. Batch processing of pin assignment legality verification often took longer than 3 minutes because all the pins are checked against all the rules. By checking one pin at a time against a subset of rules, e.g., I/O buffer rules only or I/O buffer rules plus some I/O system rules, the legality verification time is dramatically reduced to a few seconds, even for complex designs. For example, a pin assignment legality verification for a medium-sized design takes about 2 or 3 seconds.

A particular feature of the present invention is to not require a netlist prior to pin assignments. Traditionally, I/O pin assignments occur after all of the logic description design. By distinguishing between I/O buffer rules and I/O system rules, certain rules that do not require a netlist may be checked in real-time as pin assignments are made. Not requiring a netlist means that some physical design can be made before the logic design is complete. Allowing some parallel designing reduces the critical path for the entire system. Of course final verification of the pin assignments including unchecked I/O system rules that require netlist traversal still needs to occur after the logic description design is completed.

Yet another feature of the present invention is the ability to share the I/O checking module between a PLD manufacturer and third-party board design software vendors. Because each PLD product, e.g., FPGA or CPLD, requires different I/O rules, third-party board design software vendors have had to implement all of the PLD manufacturer rules into their software code before their software could be used to design a system using that particular PLD. The complex I/O rules often means that support of a particular PLD in third-party board design software lags the product release, often by months and sometimes by more than one year. Third-party design software may incorporate the I/O checking module or may call the module to perform legality verifications. Painstaking implementation of all of the I/O rules is no longer necessary. As result, board design software support for new PLD products would become available sooner.

These and other features of the present invention will be presented in more detail in the following specification of the invention and the accompanying figures, which illustrate by way of example the principles of the invention.

DESCRIPTION OF PARTICULAR EMBODIMENTS

Reference will now be made in detail to some specific examples of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims.

For example, the techniques of the present invention will be described in the context of FPGA design, specifically physical design using Quartus II™ from Alterra Corporation of San Jose, Calif. However, it should be noted that the techniques of the present invention can be practiced with other Electronic Design Automation (EDA) tools. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Various techniques and mechanisms of the present invention will sometimes be described in singular form for clarity. However, it should be noted that some embodiments include multiple iterations of a technique or multiple instantiations of a mechanism unless noted otherwise. For example, an operation of editing a pin property is used in a variety of contexts. However, it will be appreciated that multiple pin properties can be edited while remaining within the scope of the present invention unless otherwise noted. Furthermore, the techniques and mechanisms of the present invention will sometimes describe two entities as being connected. It should be noted that a connection between two entities does not necessarily mean a direct, unimpeded connection, as a variety of other entities may reside between the two entities.

To implement a FPGA design as part of an OEM device, not only the FPGA itself must be designed and configured, but the board on which the FPGA is installed. A valid board design complies with all the inputs and outputs of the FPGA. Thus, obtaining valid pinouts or verifying pinouts accelerates the board design process.

Figure 1:
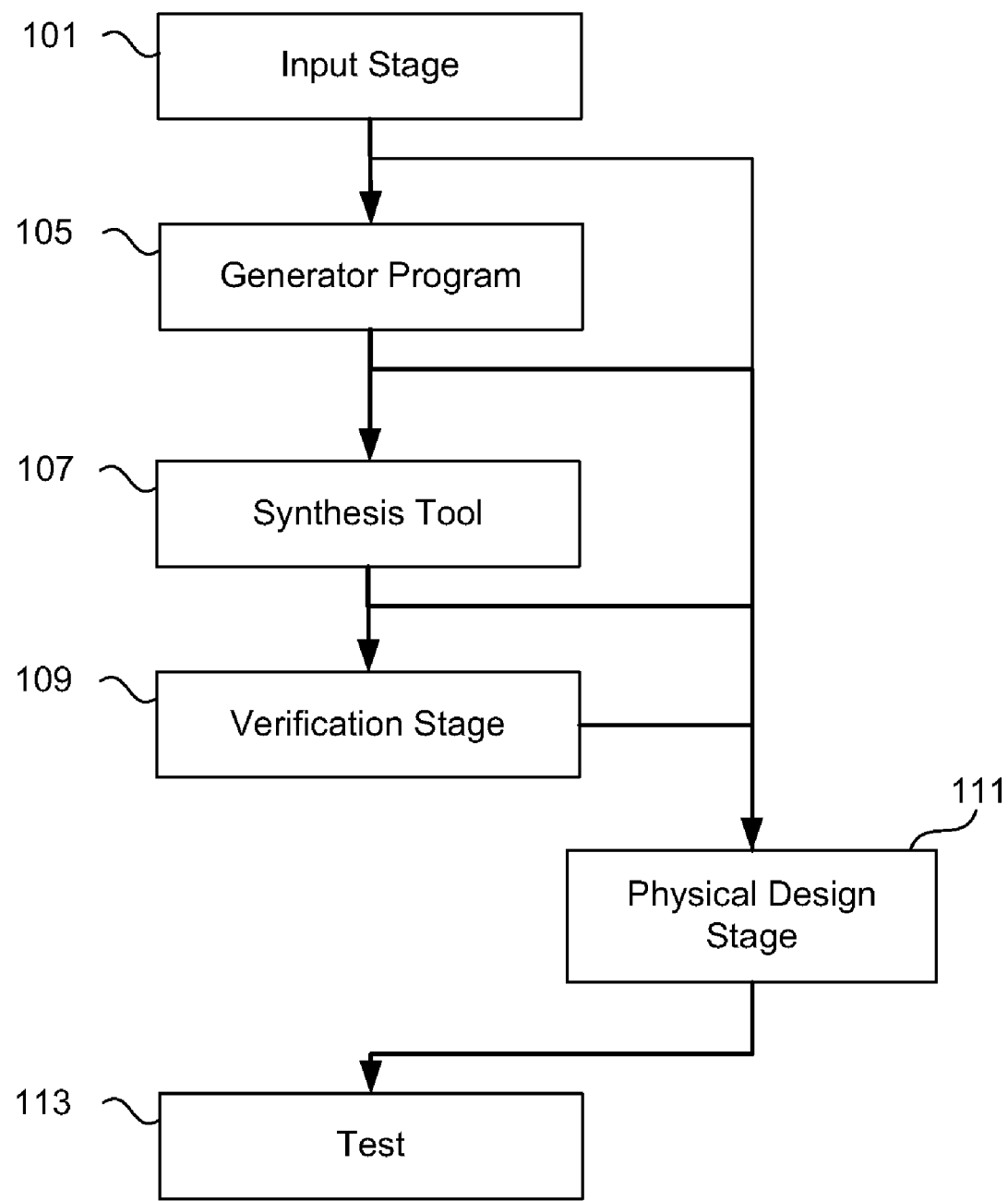
FIG. 1 is a process flow diagram depicting a PLD design process in accordance with certain embodiments of the present invention.

FIG. 1 is a diagrammatic representation showing a FPGA design implementation. An input stage 101 receives selection information typically from a user for logic such as a processor core as well as other components such as a streaming output to be implemented on an electronic device. In one example, the input received is in the form of a high-level language program. A generator program 105 creates a logic description and provides the logic description along with other customized logic to a synthesis tool. In one example, an input stage 101 often allows selection and parameterization of components to be used. The input stage 101 also allows configuration of variable or fixed latency support. In some examples, components provided to an input stage include intellectual property functions, megafunctions, and intellectual property cores. The input stage 101 may be a graphical user interface using wizards for allowing efficient or convenient entry of information. The input stage may also be a text interface or a program reading a data file such as a spreadsheet, database table, or schematic to acquire selection information. The input stage 101 produces an output containing information about the various modules selected.

In typical implementations, a generator program 105 receives the output of the input stage and generates a logic description with information for implementing the various modules. A feature of an embodiment of the present invention allows certain physical design 111, e.g., pin assignments, to take place even before the generator program 105. The generator program 105 can be a Perl script creating HDL files such as Verilog, Abel, VHDL, and AHDL files from the module information entered by a user. In one example, the generator program identifies a portion of a high-level language program to accelerate. The other code is left for execution on a processor core. According to various embodiments, the generator program 105 identifies pointers and provides ports for each pointer. One tool with generator program capabilities is System on a Programmable Chip (SOPC) Builder available from Altera Corporation of San Jose, Calif. The generator program 105 also provides information to a synthesis tool 107 to allow HDL files to be automatically synthesized. In some examples, a logic description is provided directly by a designer. Hookups between various components selected by a user are also interconnected by a generator program. Some of the available synthesis tools are Quartus Integrated Synthesis (QIS) from Altera Corporation of San Jose, Calif., Precision Synthesis, available from Mentor Graphics Corporation of Wilsonville, Oreg. and Synplify available from Synplicity Corporation of Sunnyvale, Calif. The HDL files may contain technology specific code readable only by a synthesis tool. The HDL files at this point may also be passed to a simulation tool.

As will be appreciated by one of skill in the art, the input stage 101, generator program 105, and synthesis tool 107 can be separate programs. The interface between the separate programs can be a database file, a log, or simply messages transmitted between the programs. For example, instead of writing a file to storage, the input stage 101 can send messages directly to the generator program 105 to allow the generator program to create a logic description. Similarly, the generator program can provide information directly to the synthesis tool instead of writing HDL files. Similarly, input stage 101, generator program 105, and synthesis tool 107 can be integrated into a single program.

A user may select various modules and an integrated program can then take the user selections and output a logic description in the form of a synthesized netlist without intermediate files. Any mechanism for depicting the logic to be implemented is referred to herein as a logic description. According to various embodiments, a logic description is an HDL file such as a VHDL, Abel, AHDL, or Verilog file. A logic description may be in various stages of processing between the user selection of components and parameters to the final configuration. According to other embodiments, a logic description is a synthesized netlist such as an Electronic Design Interchange Format Input File (EDIF file). An EDIF file is one example of a synthesized netlist file that can be output by the synthesis tool 107.

A synthesis tool 107 can take HDL files and output EDIF files or other netlist description formats such as structural VHDL or structural Verilog. Tools for synthesis allow the implementation of the logic design. Various synthesized netlist formats will be appreciated by one of skill in the art.

A verification stage 109 may precede or follow the synthesis stage 107. The verification stage checks the accuracy of the design to ensure that an intermediate or final design realizes the expected requirements. A verification stage typically includes simulation tools and timing analysis tools. Tools for simulation allow the application of inputs and the observation of outputs without having to implement a physical design onto a PLD. Simulation tools provide designers with cost effective and efficient mechanisms for both functional and timing verification of a design. Functional verification involves the circuit's logical operation independent of timing considerations. Parameters such as gate delays are disregarded.

Timing verification involves the analysis of the design's operation with timing delays. Setup, hold, and other timing requirements for sequential components such as flip-flops are confirmed. Some available simulation tools include Synopsys VCS, VSS, and Scirocco, available from Synopsys Corporation of Sunnyvale, Calif. and Cadence NC-Verilog and NC-VHDL available from Cadence Design Systems of San Jose, Calif.

A physical design stage 111 typically follows the synthesis tool 107 or the verification stage 109. A synthesized netlist file is provided to physical design tools including place and route and configuration tools. The place and route tool typically locates logic cells on specific logic elements of a target hardware component and connects wires between the inputs and outputs of the various elements in accordance with logic required to implement an electronic design. These various elements may be phase lock loops (PLLs), input/output (I/O) cells and controller, digital signal processing (DSP) blocks, central procession unit (CPU), internal memory, network processor, hardware accelerator, external memory interface, display controller, peripherals, and DMA engine.

As part of the physical design, input and output pins are assigned and positioned based on a variety of input/output (I/O) rules and restrictions. These rules are traditionally implemented at the same time, thus requiring a synthesized netlist. In order to place and assign one pin, pin properties as to the surrounding pins and the bank properties in which the pin is positioned may need to be specified first. Conversely, an assignment of one pin at one position restricts assignment of other pins at surrounding positions. As an example, any single I/O bank may only be able support one $V_{CCIO}$ setting though many settings are available. All pins in the same I/O bank must use compatible $V_{CCIO}$ levels for input and output pins. Thus bank properties may affect whether a pin assignment is legal. Once a pin is assigned, pins with incompatible $V_{CCIO}$ levels cannot be added. Even more complicated rules require netlist traversals, where a pin property assignment is checked against each and every rule and components for possible violations through permutations of different pin property combinations. Compound the netlist traversals with tens if not hundreds of such rules, the time required to verify pin assignment legality can take many minutes, for more complex designs more than 3 minutes even with fast computers.

The I/O rules and restrictions are separated into I/O buffer rules and I/O system rules. I/O buffer rules are generally those that do not require a netlist traversal. Examples include voltage compatibility rules, current-density rules, Simultaneously Switching Output (SSO) rules, current strength rules, I/O standard rules, and I/O location compatibility rules. I/O system rules may require netlist traversals to verify. Generally, I/O system rules are more complicated than buffer rules and require status of other pins and components be known. Examples include the requirement that dynamic phase alignment (DPA) groups have a 1-channel buffer zone in between and that corner phase locked loops (PLL) cannot drive (low voltage differential signal) LVDS channels outside their quadrants.

In accordance with an embodiment of the present invention, pin assignments can be made without a netlist generated from a synthesis tool 107 or a HDL file from a generator program 105 by checking a number of the I/O rules, e.g., only the I/O buffer rules. Because checking the I/O buffer rules does not require a netlist traversal, it can be done even as early as the input stage. Earlier pin assignment allows concurrent board design to occur, reducing overall design time for a new device. Pin-outs for a set of the more important connections may be specified as the chip is being designed and provided to a board designer, who can then concurrently make a valid board design. The remaining pin-outs are assigned by the physical design software module, e.g., an I/O Placer module. However, without checking all of I/O system rules, the pinouts may still change when the full system is compiled. When pinouts change, corresponding adjustment must be made to the board design as well.

Once the input and output pins are specified, the entire design may be compiled to fit all the elements in the PLD. This compilation is usually followed by a final timing analysis step to sign off on the timing constraints, now that all the actual timing paths between sequential elements are known. The PLD, e.g., FPGA, can also be physically tested at 113. Verified legal input and output pins also allow a board design to proceed.

For PLDs, a programmable logic configuration stage can take the output of the place and route tool and generate a bit stream that is used to program the logic with the user selected and parameterized modules. According to various embodiments, the place and route tool and the logic configuration stage are provided in the Quartus Development Tool, available from Altera Corporation of San Jose, Calif.

As noted above, different stages and programs can be integrated in a variety of manners. According to one embodiment, the input stage 101, the generator program 105, the synthesis tool 107, the verification tools 109, and physical design tools 111 are integrated into a single program. The various stages are automatically compiled and ran transparently to a user. The program can receive the user selected modules, generate a logic description depicting logic for implementing the various selected modules, and implement it. The program and method of certain embodiments of the present invention can still be used to check and assignment pins before the full compile.

Figure 2:
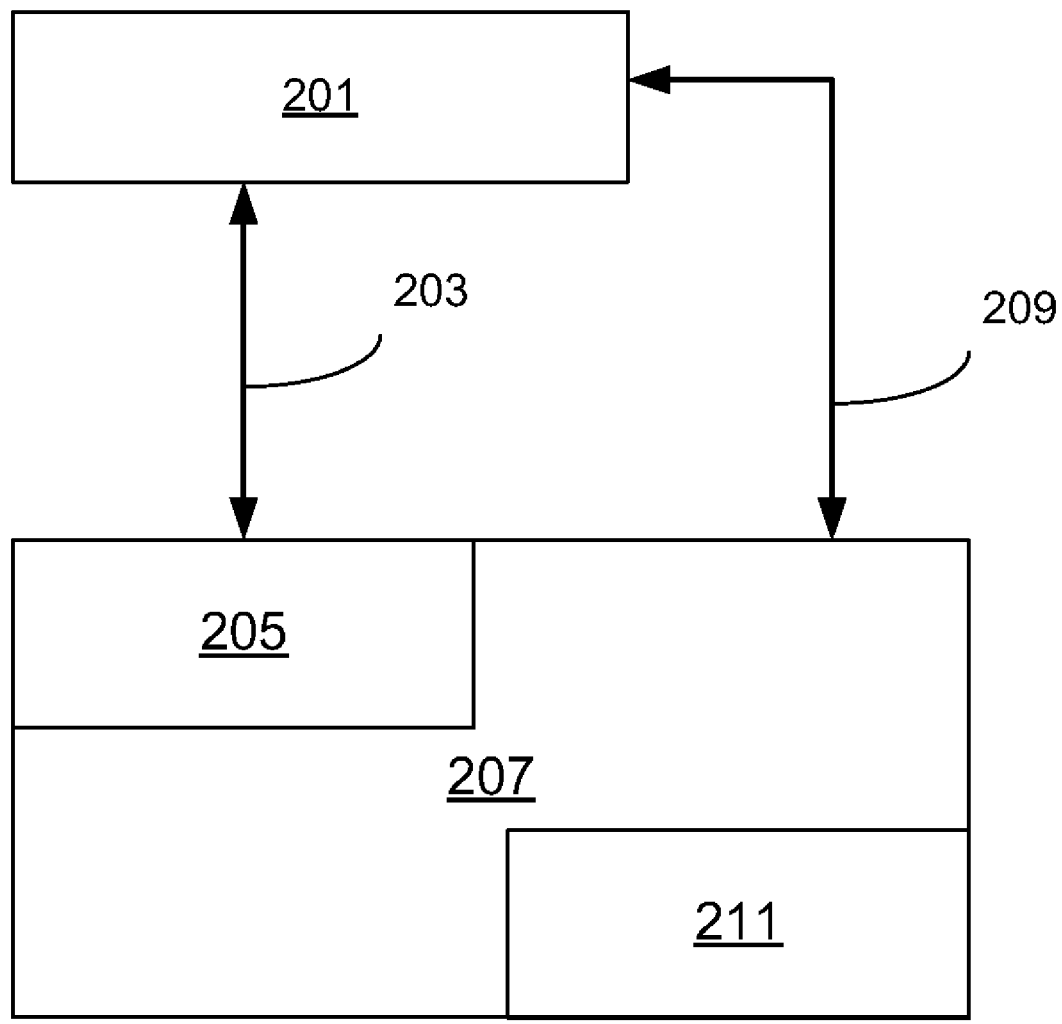
FIG. 2 is a schematic of various design modules and their relationships.

FIG. 2 illustrates a number of modules in a physical design software and their relationships. Element 201 is a graphical user interface (GUI), a spreadsheet, board design software, or another input mechanism that can be used to enter pin properties and locations. The GUI 201 can communicate with Live I/O checker module 205 via pipe 203. The Live I/O checker module 205 includes program instructions for checking a subset of I/O rules and restrictions previously defined as I/O buffer rules. The actual rules checked by I/O checker module 205 vary from chip to chip and in some instances from design to design. The I/O checker responds to a request by the GUI in a relatively short amount of time, e.g., less than about 3 seconds, preferably in about 1 second. In certain embodiments, if a netlist is present, the I/O checker may be able to check simple I/O system rules if it can be done in a relatively short amount of time.

In certain embodiments in accordance with the present invention, the I/O checker module runs on a background thread and preferably on a different CPU from the GUI. Many computers are equipped with multiple CPUs. Running the I/O checker on a separate and likely less utilized CPU reduces the likelihood the GUI application slows down because of the I/O checker. The I/O checker is typically initiated by the user in the GUI and is terminated when the GUI is terminated or manually by the user. The I/O checker does not save information onto the design database as part of the check.

The communication channel 203 between the GUI 201 and the I/O checker 205 may be a pipe, a binary call, or a tcl api call. The I/O checker 205 may be designed to recognize various communication methods in various embodiments. In certain embodiments, the I/O checker receives a tcl api command from the GUI and returns results the same way. The communication is performed in the background transparent to the user.

The GUI and the I/O checker need not come from a same software package to work via the communication channel. In certain embodiments, the GUI and the I/O checker are both portions of Quartus Development Tool available from Altera Corporation of San Jose, Calif. The GUI may also be a third party software that can initialize and call an installed version of the Quartus I/O checker. The Quartus I/O checker may be made available to a third party software vendors, e.g., a board designer software vendor, for incorporation into their software so that the third party vendors do not have to code the I/O rules. Reducing these codes may reduce the time for a third party board design vendor to support a new chip.

Referring to FIG. 2, the I/O checker 205 is shown as a part of a larger module 207. Module 207 includes I/O checker 205, I/O placer 211. In certain embodiments, module 207 is the physical design software. In other embodiments, module 207 is a part of the software that generates a pin-out file as part of "place and route." In a particular embodiment, the module 207 is the fitter module and the I/O checker is the Live I/O Check Module of Quartus.

The I/O placer 211 does not communicate to the GUI via communication channel 203. Instead, it is part of the module that assigns pin properties to unassigned pins during a compilation of module 207. GUI 201 may initiate a batch compilation to via route 209 to assign and check all pins. The fitter 207 checks for validity of pin assignments using I/O checker 205 and places unassigned pins using I/O placer 211. Fitter 207 also includes functionality to check other I/O rules not checked by the I/O checker 205, such as certain I/O system rules. Generally, rules requiring netlist traversal, e.g., system rules, are checked by Fitter 207; however, when a netlist is available, certain system rules may be checked by I/O checker 205. The ability to check system rules with the I/O checker may vary with design complexity and may be a feature users can select when I/O checker is enabled.

Figure 3:
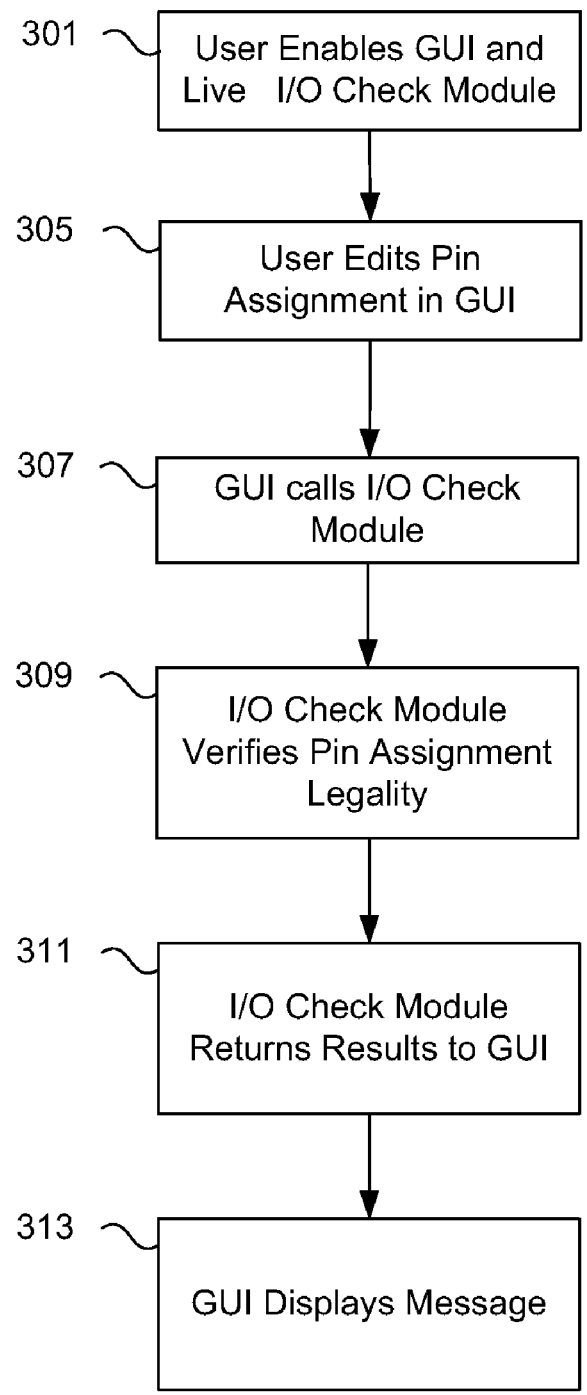
FIG. 3 is a process flow diagram depicting a pin assignment process in accordance with certain embodiments of the present invention.

A technique of pin placement in accordance with certain embodiments of the present invention is depicted in FIG. 3. As part of the physical design process from FIG. 1, a user enables the GUI or some other input method to enter pin assignments and change pin properties at operation 301. The user also enables a software module, e.g., Live I/O Check (element 205 of FIG. 2), that performs instantaneous checks of I/O rules and restrictions based on user inputs. The user may be able to configure the I/O check module to specify the types of messages or result format to use and may be the types of rules to be checked.

In certain embodiments of the present invention, the GUI is the Pin Planner tool from Altera Corporation available as a part of Quartus. However, the GUI may also be a third party tool configured to communicate to an I/O checker module.

The user then edits a pin assignment in the GUI at operation 305. The edit can include pin properties, such as input, output, I/O standard, or location. The edit may be performed by entering properties into a table, by moving pins with a mouse (click and drag) or by selecting properties in a menu. A user may edit more than one property for a pin. For example, a user may change the I/O standard for a pin and then place the pin at a location.

When the GUI receives the edit, it calls the I/O Check module in operation 307. The call may be performed via a tcl api command, a pipe command, a binary command, or other software to software protocols. The call is transparent to the user. In other words, the call is automatic upon every pin or pin property edited. The call command includes information on the pin and property edited. When more than one property is edited, preferably only one call is made, so that the user reviews only one result messages per pin.

On a background thread, the I/O check module checks pin assignment legality in operation 309. As discussed above, the user may be able to specify which or the subset of rules to check. In certain embodiments, the I/O check module checks all the I/O buffer subset of I/O rules. The I/O check module determines which and how many rules are violated. In a preferred embodiment, the I/O check module also determines which and how many warnings for potential rule violations. For example, a rule may require the location of two or more pins be known such as a differential pair that must be located within a certain number of pads between each other and from other known pins. A user may have entered pin properties that have not violated this rule because the other pins are not yet assigned. In this case there may be a warning message to alert the user that future pin assignments are restricted.

Figure 5A:
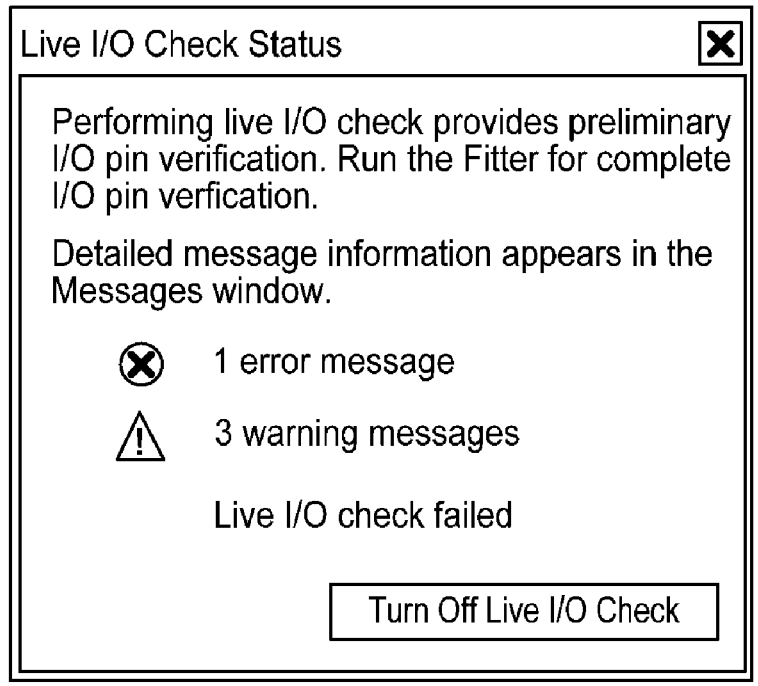
FIGS. 5A and 5B illustrate examples of results displayed by the GUI from the I/O Verification.
Figure 5B:
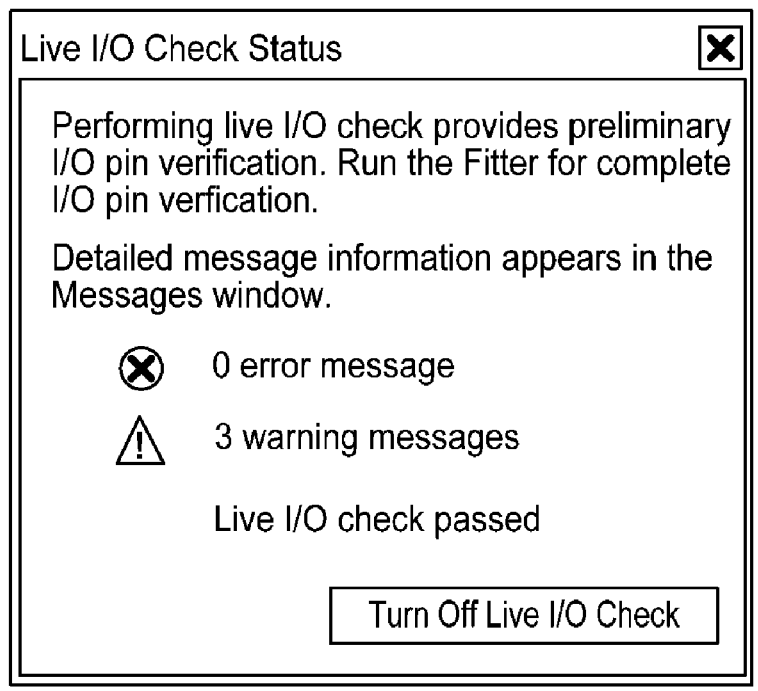

After the pin assignment validity is verified or checked, the I/O check module returns results to the GUI, in operation 311. The result is normally returned to the GUI using a same communication channel as the call checking command. The GUI then displays the message in operation 313. The result may be in the form of a message window, scroll text, or be represented graphically. Preferably, the result is displayed before the user starts another pin property edit. FIGS. 5A and 5B are examples of message window results. In FIG. 5A, the message window shows the number and type of messages and a status of the check. Because there was 1 error message, the Live I/O Check failed. FIG. 5B is an example of a passing Live I/O Check. Note that there were no error messages and 3 warning messages. Thus, a pin edit can pass the I/O check even if warning messages result.

Another form of result presentation may be scrolling text. The pin planner GUI includes a configurable scrolling text box that shows status text message. As new status text appears it is appended to the bottom of the text box. A user can scroll the text box to see previous messages. For details regarding which rules were violated, a user can review the text box.

Figure 6A:
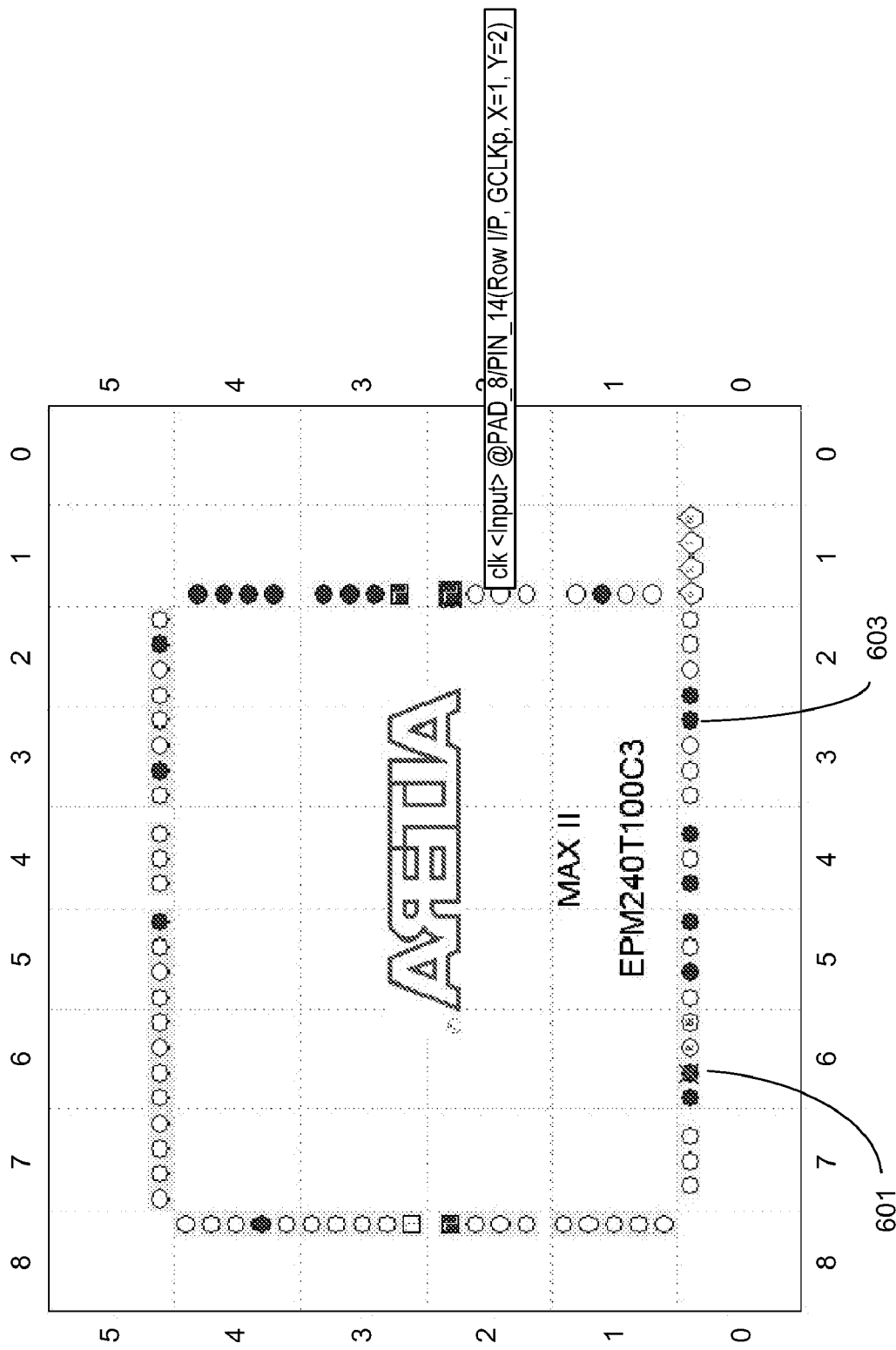
FIGS. 6A and 6B illustrate examples of results displayed by the GUI from the I/O Verification.
Figure 6B:
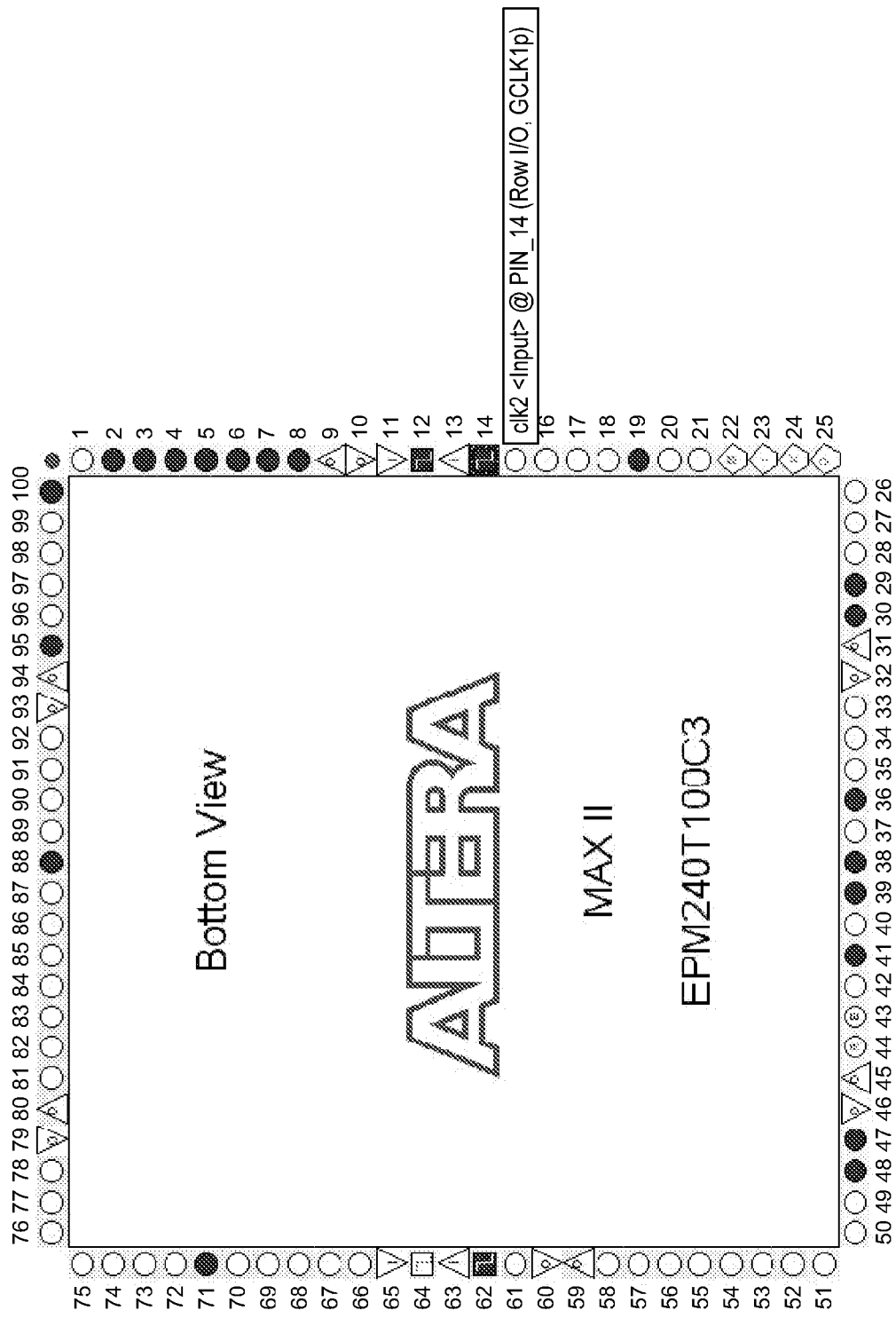
Figure 7:
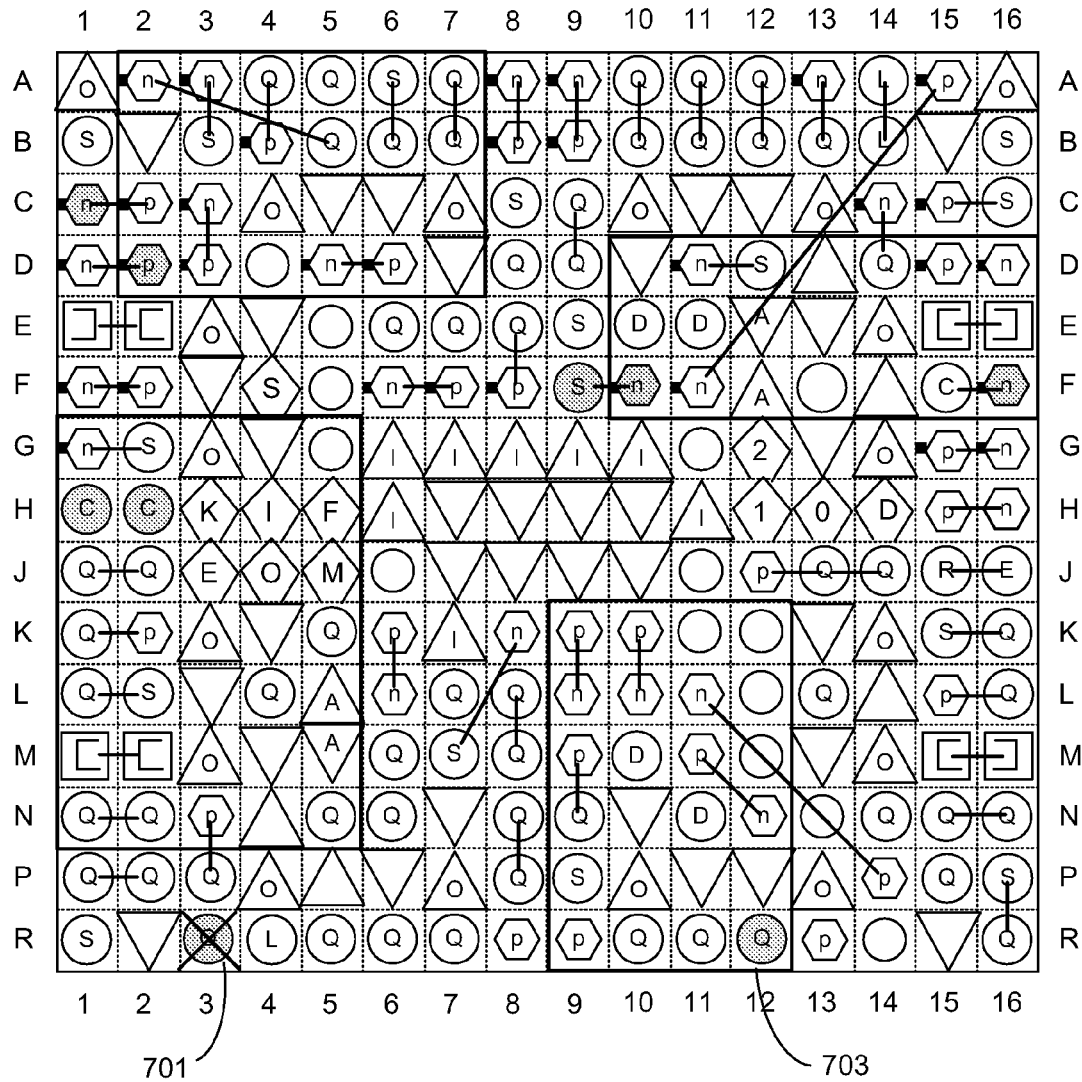
FIG. 7 is a schematic of a pin placement grid illustrating results displayed by the GUI from the I/O Verification.

Yet another form of results presentation may be graphic through the GUI. An example of failed pin assignment is shown on FIG. 6A at 601. In the example of FIG. 6A, a cross is displayed on the icon of the pin to show that I/O check has failed at 601. Assigned pins are shaded. Thus pin 603 is an assigned pin that passed I/O check. In addition to the pins on the chip, as shown on FIGS. 6A and 6B of the front and back of the chip, pins on the package are also assigned, such as shown in FIG. 7. FIG. 7 is a pin placement grid diagram showing various pin positions and some pin properties. As in FIGS. 6A and 6B, assigned pins are shaded. Pin icon geometries and internal symbols and letters denote different kinds of pins. Differential pins are linked by a line. Pins belonging to one input/output bank (I/O bank) are grouped together. Pin 701 is an example of a pin that failed I/O check while pin 703 passed.

The time lapse between the GUI receiving a pin edit to the user see a display message is normally on the order of few seconds, preferably less than 3 seconds. Using this technique, a user can make pin assignments without knowing every I/O buffer rule. Because the results are returned almost instantaneously, any error can be corrected before another pin assignment is made. The user need not correct all errors, however. The user is not barred from changing another pin property even if the I/O check failed.

Figure 4:
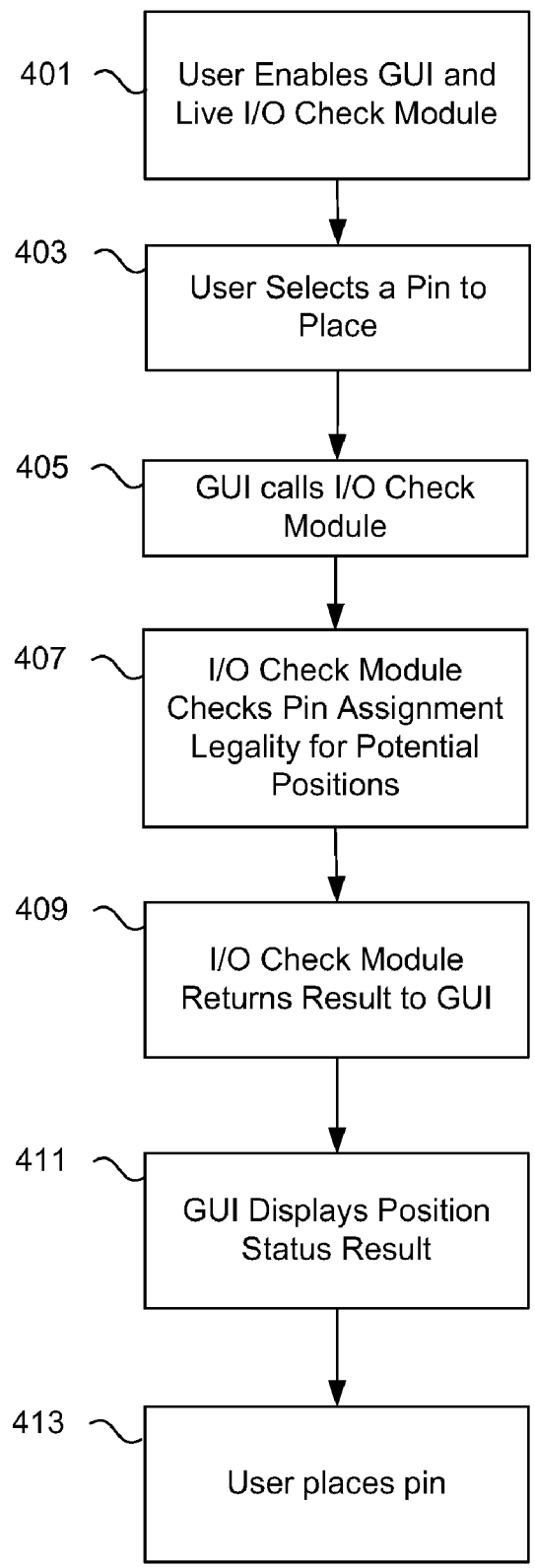
FIG. 4 is a process flow diagram depicting a pin placement process in accordance with certain embodiments of the present invention.

Another technique of pin placement is shown in FIG. 4. With this technique, a user can select a pin to place and be shown potential positions to place. As a first operation 401, the user enables an input program, which may be a GUI program. The user also enables the I/O check module. The user then selects a pin to place at operation 403. In certain embodiments, this pin selection may be a simple click on a mouse button, selecting an operation from a menu, a keystroke while a pin is clicked, or any other means to select a pin to place for the GUI. In one example, the user may click and drag a pin to a specific location on the GUI to select the pin. In another example, the user may double click or right click a pin to select the pin to place. At operation 403, the GUI program receives an indication of a pin to place.

At operation 405, the GUI program calls the I/O check module with the selected pin information via a command pipe as described above. The I/O check module then checks pin assignment legality for all potential positions for the selected pin at operation 407. The check performed in this operation is different from that of operation 309 of FIG. 3. Instead of checking whether a pin property in the command is legal, the I/O check module finds all potential positions for the selected pin that is legal.

The I/O check module checks legality for the selected pin against sets of pin positions. In certain embodiments, the I/O check module checks legality for all unassigned pin positions. Referring to FIG. 5A, unassigned pin positions are those that are not shaded and are available for placement. The I/O check module would perform a legality check against each and everyone of the available positions and returns result to the GUI in operation 409. In other embodiments, the I/O check module checks legality for all pin positions whether assigned and unassigned. In certain embodiments, the I/O check module checks whether swapping with an assigned pin is legal for both the swapped pin and the selected pin. Whether the I/O check module checks legality for all pin positions or only unassigned pin positions, or whether swapping legality is checked may be user-defined properties. Of course, the I/O check would be faster if only unassigned pins are checked. Thus during initial pin assignment when many pin positions are empty, checking only unassigned pins may save time. After all or most of pins have been assigned, I/O checker may not find a legal unassigned position. In that case checking all pin positions may make more sense.

The GUI displays a position status result to the user at operation 411. The result shows potential pin positions for placement for the selected pin. In certain embodiments, the result is displayed graphically via the GUI where legal pin positions are highlighted to the user, e.g., in a different color, shading, line width, graying out illegal positions etc. The result also may be displayed as a listing of all the legal positions.

With the legal positions shown, the user can place the selected pin into a desired position in operation 413. In certain embodiments, placement of a selected pin into an illegal position is not allowed. In other embodiments, placement of a selected pin into an illegal position is allowed, preferably after the user verifies the placement, e.g., in a dialog box.

One advantage of the present invention is to not require a netlist or HDL prior to pin assignments. Traditionally, I/O pin assignments occur after all of the logic description design. By distinguishing between I/O buffer rules and I/O system rules, certain rules that do not require a netlist or HDL may be checked in real-time as pin assignments are made. Allowing some parallel logic description and physical design reduces the critical path for the system design and allows concurrent board design to occur. A designer can manually assign the more important pins using the I/O checker and leave the rest of the pin assignments to the fitter compiler. This way, a partial pinout file of the more important pins can be obtained before even the HDL is generated. Of course final verification of the pin assignments including I/O system rules that require netlist traversal still needs to occur after the logic description design ends.

Another advantage of the present invention is to reduce the time to verify the legality of a pin assignment. Running the full fitter (module 207 in FIG. 2) can take up to several minutes. Checking pin assignment legality by running the full fitter is a time consuming process. If a user checks several pin assignments at the same time, cumulative mistakes can make corrections even more difficult. Being able to instantaneous verify pin assignments as to the I/O buffer rules reduces or eliminates many of these mistakes.

Although many of the components and processes are described above in the singular for convenience, it will be appreciated by one of skill in the art that multiple components and repeated processes can also be used to practice the techniques of the present invention.

While the invention has been particularly shown and described with reference to specific embodiments thereof, it will be understood by those skilled in the art that changes in the form and details of the disclosed embodiments may be made without departing from the spirit or scope of the invention. For example, although FPGAs are used in the various examples, the present invention is not limited to an implementation involving an FPGA as the PLD. The present invention contemplates the use of other types of programmable chip such as Complex Programmable Logic Devices (CPLD). In another example, the present invention may be practiced with a design software type not discussed above. It is therefore intended that the invention be interpreted to include all variations and equivalents that fall within the true spirit and scope of the present invention.

What is claimed is:

1. A method comprising:
   in a computing system receiving an edit to a pin property of a pin;
   checking a plurality of input/output rules for the pin property in response to said receiving; and
   displaying results indicating legal positions of the pin;
   wherein the checking is performed on a background thread.

2. The method of claim 1, wherein the receiving, checking, and displaying are performed by one or more modules in a pin planning tool, wherein the one or more modules is a graphic user interface module, an input/output checking module, or both.

3. The method of claim 2, wherein the background thread is processed on a different processor from a foreground thread associated with the graphic user interface module.

4. The method of claim 2, further comprising calling the input/output checking module from the graphic user interface module.

5. The method of claim 1, wherein the checking is performed without a netlist traversal.

6. The method of claim 1, wherein the results further comprise an indication of illegal positions of the pin, number of errors, number of warnings, status of check, reason for error, reason for warnings, and combinations thereof.

7. A non-transitory computer-readable medium comprising computer-executable instructions which, when executed by a computer, cause the computer to perform the method of claim 1.

8. A method comprising:
   in a computing system receiving an input from a user, wherein said input enables an input/output checking module for checking input/output rules;
   receiving an edit to one or more pin properties of a pin; and
   transmitting a message, said message comprising an indication of legal positions of the pin.

9. The method of claim 8, wherein the message further comprises an indication of illegal positions of the pin, number of errors, number of warnings, reason for error, and reason for warnings.

10. The method of claim 8, wherein receiving an edit comprises receiving information from a spreadsheet, detecting movement of a pin on a graphic user interface, and detecting a change in property values presented to a user by a drop down box.

11. The method of claim 8, wherein a duration between receiving an edit and transmitting a message is about 3 seconds or less.

12. The method of claim 8, wherein the transmitting occurs in response to the receiving.

13. A non-transitory computer-readable medium comprising computer-executable instructions, the instructions which, when executed by a computer, cause the computer to perform the method of claim 8.

14. A method comprising:
   in a computing system receiving a pin selection indicating a selected pin;
   checking a subset of input/output rules for the selected pin against potential pin positions; and
   displaying results indicating legal positions of the selected pin;
   wherein the checking is performed on a background thread.

15. The method of claim 14, wherein the receiving, checking, and displaying are performed by one or more modules in a pin planning tool, wherein the one or more modules comprise a graphic user interface module and an input/output checking module.

16. The method of claim 15, wherein the background thread is processed on a different processor from a foreground thread associated with the graphic user interface module.

17. The method of claim 15, further comprising calling the input/output checking module from the graphic user interface module.

18. The method of claim 15, wherein the checking operation is performed in response to the receiving automatically without further input.

19. The method of claim 14, wherein the potential pin positions are unassigned.

20. The method of claim 14, wherein the results comprise a map or list of available positions for the selected pin.

21. The method of claim 19, wherein the results comprise a map or a list of legal positions for the selected pin.

22. The method of claim 19, wherein the results comprise a map or list of all potential pin positions with a legality status indication for the selected pin at each potential pin position.

23. The method of claim 19, wherein the results comprise a map or list of swappable assigned positions.

24. A non-transitory computer-readable medium comprising computer-executable instructions which, when executed by a computer, cause the computer to perform the method of claim 14.

25. A method comprising:
   in a computing system receiving an input from a user, wherein said input enables an input/output checking module;
   receiving a pin selection indicating a selected pin; and
   transmitting an indication of legal positions for the selected pin.

26. The method of claim 25, further comprising: receiving an edit to one or more pin properties.

27. A non-transitory computer-readable medium comprising computer-executable instructions, the instructions which, when executed by a computer, cause the computer to perform the method of claim 25.

* * * * *